(12) United States Patent
Huang et al.

(10) Patent No.: US 10,734,276 B2
(45) Date of Patent: Aug. 4, 2020

(54) PLANARIZATION METHOD

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Po-Cheng Huang, Kaohsiung (TW); Yu-Ting Li, Chiayi (TW); Fu-Shou Tsai, Keelung (TW); Wen-Chin Lin, Tainan (TW); Chun-Liang Liu, Hsinchu (TW)

(73) Assignees: UNITED MICROELECTRONICS CORP., Hsin-Chu (TW); Fujian Jinhua Integrated Circuit Co., Ltd., Quanzhou, Fujina Province (CN)

( * ) Notice: Subject to any disclaimer, the term of this patent is extended or adjusted under 35 U.S.C. 154(b) by 0 days.

(21) Appl. No.: 15/862,564

(22) Filed: Jan. 4, 2018

(65) Prior Publication Data
US 2018/0197749 A1    Jul. 12, 2018

(30) Foreign Application Priority Data
Jan. 6, 2017   (CN) .......................... 2017 1 0011311

(51) Int. Cl.
*H01L 21/768*   (2006.01)
*H01L 27/108*   (2006.01)
(Continued)

(52) U.S. Cl.
CPC .. *H01L 21/76829* (2013.01); *H01L 21/30625* (2013.01); *H01L 21/31053* (2013.01);
(Continued)

(58) Field of Classification Search
CPC ......... H01L 21/31056; H01L 21/31055; H01L 21/31053; H01L 21/31051; H01L 21/3105; H01L 21/76829; H01L 21/76819; H01L 21/76832; H01L 21/76834; H01L 21/76837; H01L 21/762; H01L 21/76224
See application file for complete search history.

(56) References Cited

U.S. PATENT DOCUMENTS 5,384,280 A * 1/1995 Aoki ...................... H01L 21/76
148/DIG. 15
5,389,568 A * 2/1995 Yun ........................ H01L 28/91
438/396

(Continued)

*Primary Examiner* — Mark W Tornow
*Assistant Examiner* — Abbigale A Boyle
(74) *Attorney, Agent, or Firm* — Winston Hsu

(57) ABSTRACT

A planarization method is provided and includes the following steps. A substrate having a main surface is provided. A protruding structure is formed on the main surface. An insulating layer is formed conformally covering the main surface and the top surface and the sidewall of the protruding structure. A stop layer is formed on the insulating layer and at least covers the top surface of the protruding structure. A first dielectric layer is formed blanketly covering the substrate and the protruding structure and a chemical mechanical polishing process is then performed to remove a portion of the first dielectric layer until a portion of the stop layer is exposed thereby obtaining an upper surface. A second dielectric layer having a pre-determined thickness is formed covering the upper surface.

17 Claims, 8 Drawing Sheets

(51) Int. Cl.
*H01L 21/321* (2006.01)
*H01L 21/3105* (2006.01)
*H01L 21/306* (2006.01)
*H01L 21/762* (2006.01)

(52) U.S. Cl.
CPC .... *H01L 21/31056* (2013.01); *H01L 21/3212* (2013.01); *H01L 21/76254* (2013.01); *H01L 21/76832* (2013.01); *H01L 21/76834* (2013.01); *H01L 21/76837* (2013.01); *H01L 27/10808* (2013.01); *H01L 27/10844* (2013.01); *H01L 27/10894* (2013.01)

(56) References Cited

U.S. PATENT DOCUMENTS

| | | | | |
|---|---|---|---|---|
| 5,532,191 A | * | 7/1996 | Nakano | H01L 21/31053 257/E21.244 |
| 5,863,828 A | * | 1/1999 | Snyder | H01L 21/76229 438/437 |
| 6,025,279 A | | 2/2000 | Chiang | |
| 6,501,149 B2 | * | 12/2002 | Hong | H01L 21/76224 257/510 |
| 6,908,858 B2 | * | 6/2005 | Nakasato | H01L 21/31053 216/38 |
| 7,060,589 B2 | * | 6/2006 | Sato | H01L 21/76229 438/435 |
| 7,811,935 B2 | * | 10/2010 | Sandhu | H01L 21/76229 257/510 |
| 8,012,847 B2 | * | 9/2011 | Patraw | H01L 21/76229 257/506 |
| 8,575,716 B2 | * | 11/2013 | Mathew | H01L 29/0649 257/510 |
| 8,637,376 B2 | * | 1/2014 | Sugioka | H01L 21/31053 257/68 |
| 9,685,374 B1 | * | 6/2017 | Lin | H01L 21/76897 |
| 2005/0014330 A1 | | 1/2005 | Park | |

* cited by examiner

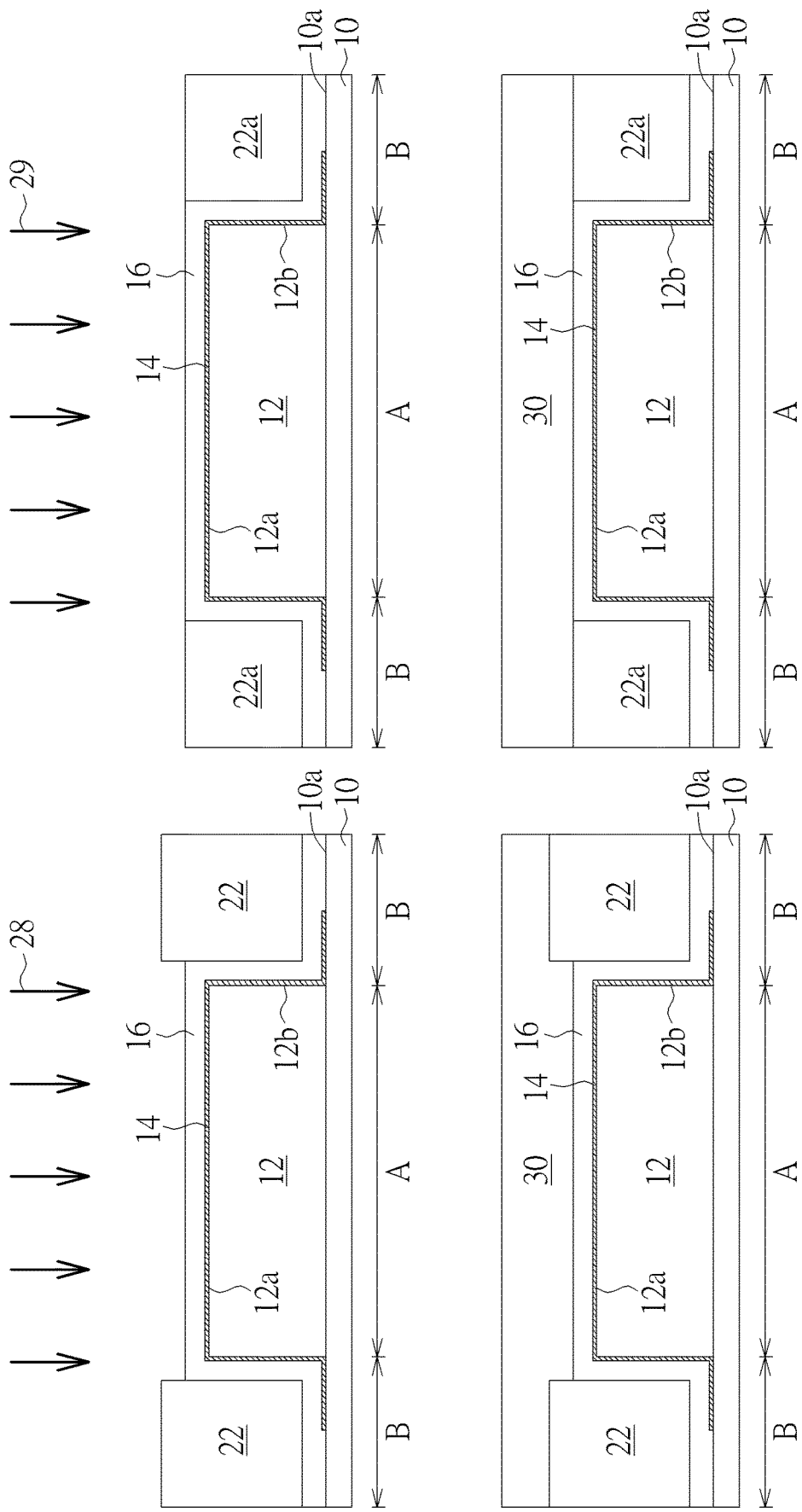

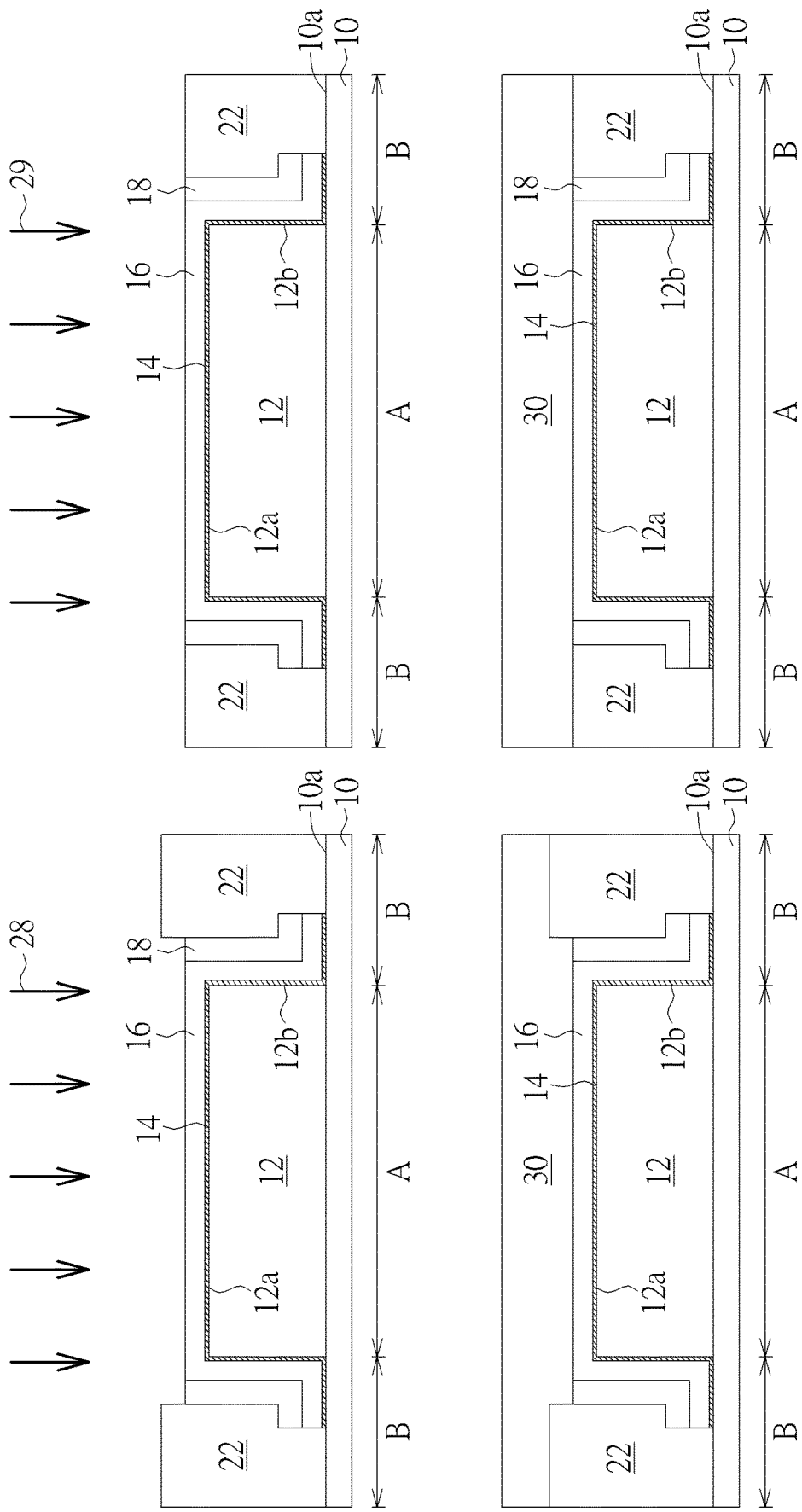

PLANARIZATION METHOD

BACKGROUND OF THE INVENTION

1. Field of the Invention

This invention related to semiconductor manufacturing. More particularly, this invention relates to a method of planarizing a semiconductor substrate.

2. Description of the Prior Art

Dynamic random access memory (DRAM) is one kind of volatile memory. A DRAM device usually includes an array region comprising plural memory cells and a peripheral region comprising control circuit. Generally, each memory cell has a transistor electrically coupled with a capacitor (1T1C). A digital data is storage in a memory cell by charging or discharging of the capacitor.

In advanced technology node of semiconductor manufacturing, the dimension of a memory cell has been miniaturized by adopting three-dimensional structure. For example, a memory cell having a capacitor (also known as crown-type capacitor) formed vertically stacked on the transistors and having the electrode extending upwardly may occupy a much smaller area of the substrate and may have more flexibility in adjusting the capacitance for different applications. For instance, the overall capacitance of a crown-type capacitor may be increased simply by increasing the height therefore increasing the overlapping area of the electrodes and the capacitance of the capacitor is increased.

However, the height of the crown-type capacitor may cause a large step height of a dielectric layer covering the array region and the peripheral region and adversely increase the difficulty of a following planarization process for planarizing the dielectric layer. Therefore, there is still a need in the field to provide an improved planarization method which is able to effectively remove the large step height and obtain a flat upper surface of the substrate and ensure the uniformity between different substrates.

SUMMARY OF THE INVENTION

One objective of the present invention is to provide an improved planarization method which may be better controlled to form an ideal flat upper surface.

According to one aspect of the present invention, a planarization method is provided. First, a substrate having a main surface is provided. A protruding structure is formed on the main surface. Subsequently, an insulating layer is formed conformally covering the main surface of the substrate and a top surface and a sidewall of the protruding structure. A stop layer is then formed on the insulating layer and covering at least the top surface of the protruding structure. A first dielectric layer is then formed blanketly covering the substrate. After that, a chemical mechanical polishing process is performed to remove a portion of the first dielectric layer until the stop layer on the top surface of the protruding portion is exposed and a flat upper surface comprising the stop layer and the first dielectric layer is obtained thereby. After that, a second dielectric layer having a pre-determined thickness is formed covering the upper surface.

According to another aspect of the present invention, a planarization method is provided. First, a substrate having a main surface is provided. A protruding structure is formed on the main surface. Subsequently, an insulating layer having a pre-determined thickness is formed conformally covering the main surface of the substrate and a top surface and a sidewall of the protruding structure. After that, a stop layer is formed on the insulating layer and only covering the top surface of the protruding structure. A first dielectric layer is then formed blanketly covering the substrate. A chemical mechanical polishing process is performed to remove a portion of the first dielectric layer until the stop layer on the top surface of the protruding portion is exposed and a flat upper surface comprising the stop layer and the first dielectric layer is obtained thereby. The stop layer is then removed and the insulating layer covering the top surface of the protruding structure is exposed.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings:

FIG. 1 to FIG. 7 are schematic drawings illustrating a planarization method according to a first embodiment of the present invention, in which FIG. 7 is a modified embodiment of FIG. 6.

FIG. 8 to FIG. 14 are schematic drawings illustrating a planarization method according to a second embodiment of the present invention, in which FIG. 14 is a modified embodiment of FIG. 13.

DETAILED DESCRIPTION

FIG. 1 to FIG. 7 are schematic drawings illustrating a planarization method according to a first embodiment of the present invention.

Figure 1:
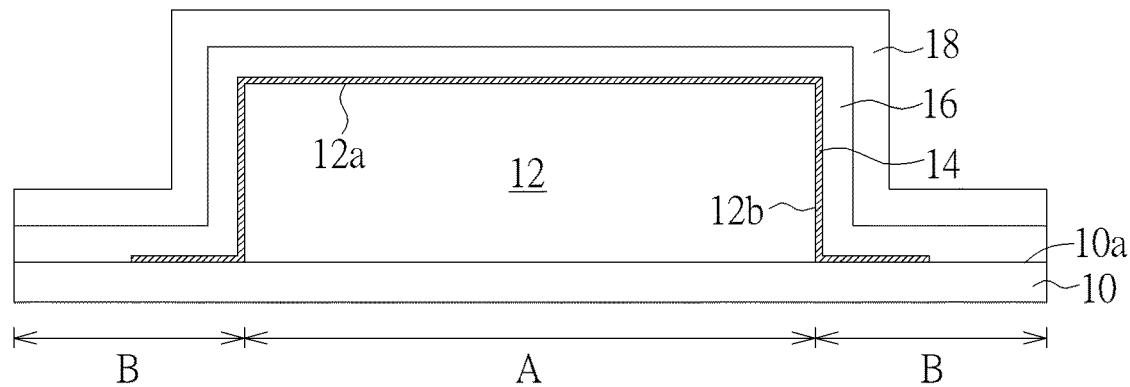

Please refer to FIG. 1. First, a substrate 10 having a main surface 10a is provided. An array region A and a peripheral region B are defined in the substrate 10. According to one embodiment, a major portion of the main surface 10a is in the array region A and a minor portion of the main surface 10a is in the peripheral region B. For example, more than 50% or even more than 75% of the main surface 10a is in the array region A. Less than 50% or even less than 25% of the main surface 10a is in the peripheral region B. A protruding structure 12 is formed on the main surface 10a in the array region A. The protruding structure 12 completely covers the array region A. When viewing from the top, the top surface 10a of the protruding structure 12 approximately has an area the same as that of the array region A. In other words, the area of the top surface 12a of the protruding structure 12 is more than 50% or even more than 75% of the main surface 10a. In one embodiment of the present invention, the substrate 10 may be a substrate for forming a DRAM device and has a plurality of transistors (not shown), word lines (not shown) and bit lines (not shown) formed therein. The protruding structure 12 may include crown-type capacitors formed vertically stacked on the array region A and have a thickness (height) measured from the top surface of the protruding structure 12 to the main surface 10a of the substrate 10. According to one embodiment, the thickness (height) of the protruding structure 12 may be approximately 1.5 to 2 micrometers (μm), or may have larger thickness (height) for providing larger capacitance. The thickness (height) of the protruding structure 12 forms an obvious step height between the array region A and the peripheral region B. It should be understood that the present invention is not limited to planarize the step height of a memory device. The present invention is also applicable to planarize the step height of other semiconductor devices.

Please still refer to FIG. 1. An insulating layer 16 and a stop layer 18 is successively formed on the substrate 10. The insulating layer 16 and the stop layer 18 conformally cover the main surface 10a of the substrate and the top surface 12a and the sidewall 12b of the protruding structure 12. According to one embodiment, the insulating layer 16 may comprise silicon oxide ($SiO_2$) having a thickness equal to or less than 100 angstroms. Preferably, the thickness of the insulating layer 16 is between 50 and 100 angstroms, but not limited hereto. The stop layer 18 may comprise silicon nitride (SiN), silicon oxynitride (SiON) or silicon carbonitride (SiCN) having a thickness equal to or less than 100 angstroms. Preferably, the thickness of the stop layer 18 is between 50 and 100 angstroms, but not limited hereto. A cap layer 14 may be formed before forming the insulating layer 16 and the stop layer 18. The cap layer 14 conformally covers the top surface 12a and the sidewall 12b of the protruding structure 12 and extends to cover a portion of the main surface 10a adjacent to the perimeter of the protruding structure 12. The cap layer 14 may be formed by forming a cap material layer (not shown) conformally and completely covering the substrate 10 and the protruding structure 12 and a patterning process is then performed to remove a portion of the cap material layer thereby obtaining the cap layer 14. According to one embodiment, the cap layer 14 may comprise insulating materials such as un-doped silicon glass (USG) used to protect and isolate the capacitors of the protruding structure 12. According to another embodiment, the cap layer 14 may comprise conductive materials such as tungsten to electrically connect the capacitors of the protruding structure 12. The stop layer 18 is not in direct contact with the cap layer 14 by being separated by the insulating layer 16.

Figure 2:
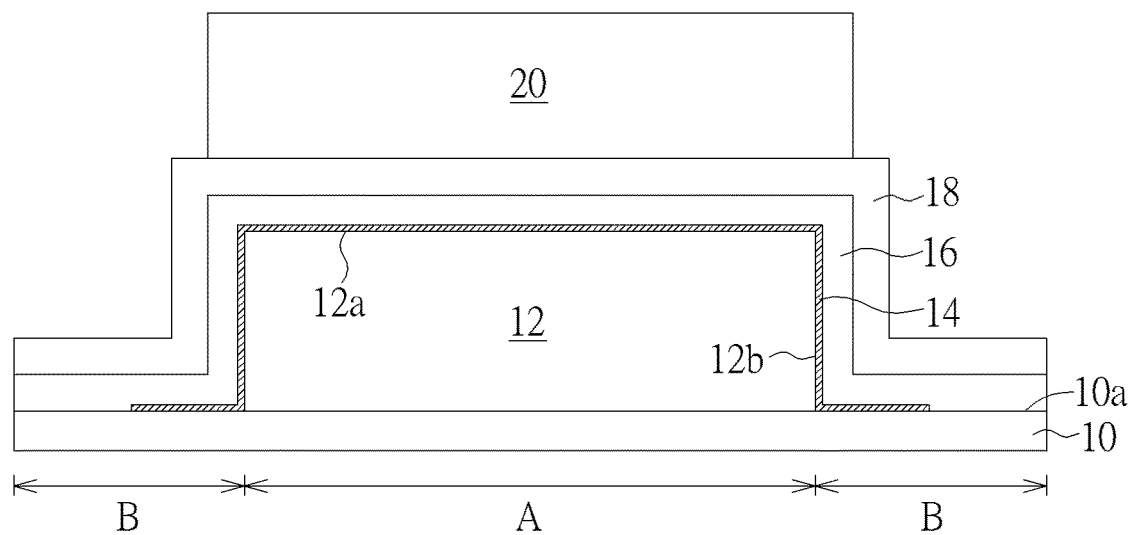
Figure 3:
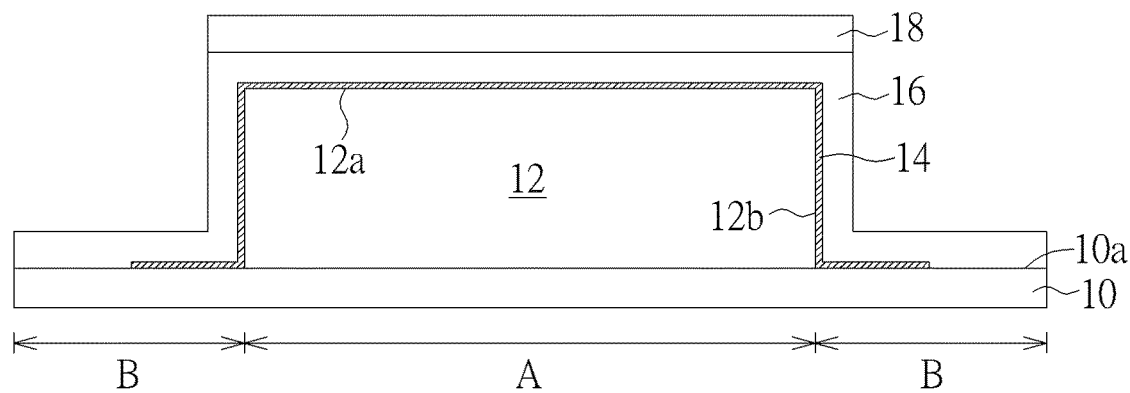

Please refer to FIG. 2 and FIG. 3. A patterning process is then performed to remove a portion of the stop layer 18. The patterning process may include forming a mask layer, for example, the photoresist layer 20, aligning with the protruding structure 12 and only covering the top surface 12a of the protruding structure 12. The stop layer 18 covers the sidewall of the protruding structure 12 and the main surface 10a is exposed from the photoresist layer 20. An etching process having high selectivity between the stop layer 18 and the insulating layer 16 is performed, using the photoresist layer 20 as an etching mask to remove the exposed stop layer 18. After the etching process, the photoresist layer 20 is removed. As shown in FIG. 3, the remaining stop layer 18 only covers the top surface 12a of the protruding portion 12. It should be noticed that after the etching process, the insulating layer 16 still completely covers the top surface 12a and sidewall 12b of the protruding structure 12 and the top surface 10a of the substrate 10.

Figure 4:
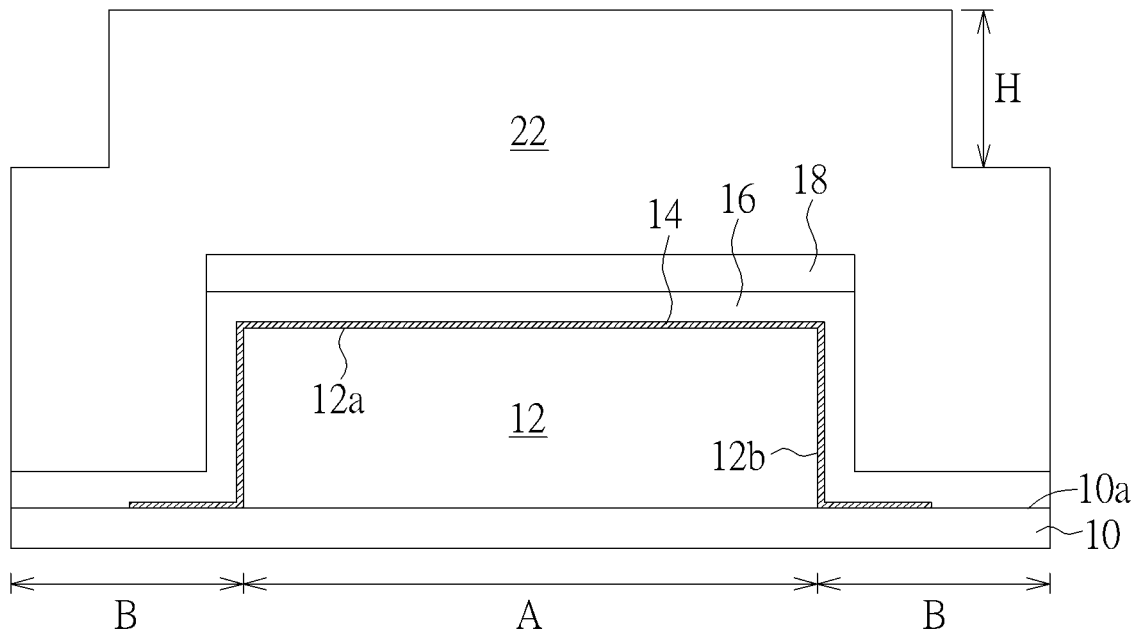

Please refer to FIG. 4. Next, a first dielectric layer 22 is formed blanketly covering the substrate 10 and the protruding structure 12. The first dielectric layer 22 may comprise dielectric material such as silicon oxide. The first dielectric layer 22 has a thickness at least larger than the thickness (height) of the protruding structure 12. Preferably, the first dielectric layer 22 has a thickness at least twice of the thickness (height) of the protruding structure 12 in order to allow a sufficient polished thickness for planarization during a subsequent chemical mechanical polishing process 24 (shown in FIG. 5). The first dielectric layer 22 is not in direct contact with the substrate 10 and the protruding structure 12 by being separated by the insulating layer 16. The thickness (height) of the protruding structure 12 may cause the first dielectric layer 22 having an obvious step height H between the array region A (the protruding structure 12) and the peripheral region B.

Figure 5:
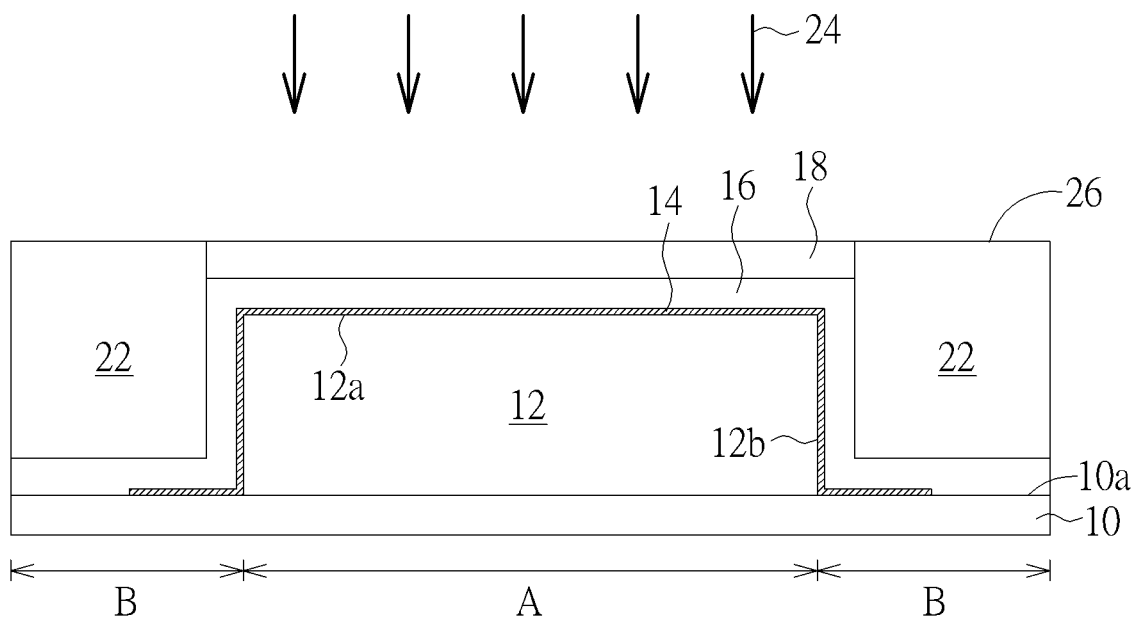

Please refer to FIG. 5. Subsequently, a chemical mechanical polishing (CMP) process 24 using the stop layer 18 as a polishing stop layer is performed to polish away a portion of the first dielectric layer 22 until the stop layer 18 is exposed. The slurry used in the chemical mechanical polishing process 24 preferably has high removal selectivity between the stop layer 18 and the first dielectric layer 22, and therefore the stop layer 18 and the first dielectric layer 22 have different removal rates in the chemical mechanical polishing process 24. According to a preferred embodiment, the ratio of the removal rate of the stop layer 18 to the removal rate of the first dielectric layer 22 in the chemical mechanical polishing process 24 is approximately 1:10. Preferably, the removal rate of the stop layer 18 in the chemical mechanical polishing process is smaller than one-tenth of the removal rate of the first dielectric layer 22 in the chemical mechanical polishing process 24. As previously illustrated, the protruding structure 12 covers a major portion (more than 50% or even more than 75%) of the area of the main surface 10a. Therefore, when the stop layer 18 covering the high topography region, that is, the top surface 12a of the protruding structure 12 is exposed during the chemical mechanical polishing process 24, the exposed stop layer 18 may forms the major portion (more than 50% or even more than 75%) of the polished surface and, advantageously, the end-point of the chemical mechanical polishing process 24 may be better controlled and the uniformity within a substrate and between different substrates may be guaranteed. Furthermore, the stop layer 18 covering the top surface 12a of the protruding portion 12 may prevent the protruding structure 12 from damage during the chemical mechanical polishing process 24. As shown in FIG. 5, after the chemical mechanical polishing process 24, a flat upper surface 26 comprising the stop layer 18 and the first dielectric layer 22 is obtained.

Please refer to FIG. 6. After the chemical mechanical polishing process 24, a selective etching process 28 is performed to remove the exposed stop layer 18 and expose the insulating layer 16 on the top surface 12a of the protruding structure 12. The selective etching process 28 may be a wet etching process having etching selectivity between the first dielectric layer 22 and the stop layer 18. After removing the stop layer 18, a second dielectric layer 30 having a pre-determined thickness is formed blanketly covering the substrate 10 and the protruding structure 12 and completely covering the array region A and the peripheral region B. According to an embodiment, the second dielectric layer 30 may have a pre-determined thickness between 2500 and 3000 angstroms. An optional buffer CMP process may be performed to improve the planarity of the second dielectric layer 30.

FIG. 7 illustrates an alternative of the process shown in FIG. 6. Please refer to FIG. 7. After the chemical mechanical polishing 24, a non-selective etching process 29, such as a dry etching process or a non-selective CMP process, is performed to remove the exposed stop layer 18 and concurrently removing a portion of the first dielectric layer 22 in a thickness approximately the same as the thickness of the removed stop layer 18. After removing the stop layer 18, a second dielectric layer 30 having a pre-determined thickness is then formed blanketly covering the substrate 10 and the protruding structure 12. It is one feature of the first embodiment that, as shown in FIG. 6 and FIG. 7, the top surface 12a of the protruding structure 12 is not covered by the first dielectric layer 22. The top surface 12a of the protruding structure 12 is covered by the insulating layer 16 and the second dielectric layer 30 as an isolating and protecting layer for subsequent process, such as forming metal interconnection or passivation.

FIG. 8 to FIG. 14 are schematic drawings illustrating a planarization method according to a second embodiment of the present invention. For the sake of simplicity, like reference numerals are used to refer to the same material layers or process steps as described in the first embodiment previously illustrated. The difference between the first embodiment and the second embodiment is that, in the second embodiment, the cap layer 14 is not patterned before forming the insulating layer 16 and the stop layer 18. In the second embodiment, the cap layer 14, the insulating layer 16 and the stop layer 18 are all patterned in a same patterning process. The patterned cap layer 14, insulating layer 16 and stop layer 18 only cover the top surface 12a and sidewall 12b of the protruding structure 12 and extend to cover a portion of the main surface 10a adjacent to the perimeter of the protruding structure 12. In comparison with the first embodiment, the second embodiment has a simplified process by omitting the step of patterning the cap layer 14 before forming the insulating layer 16 and the stop layer 18.

Figure 8:
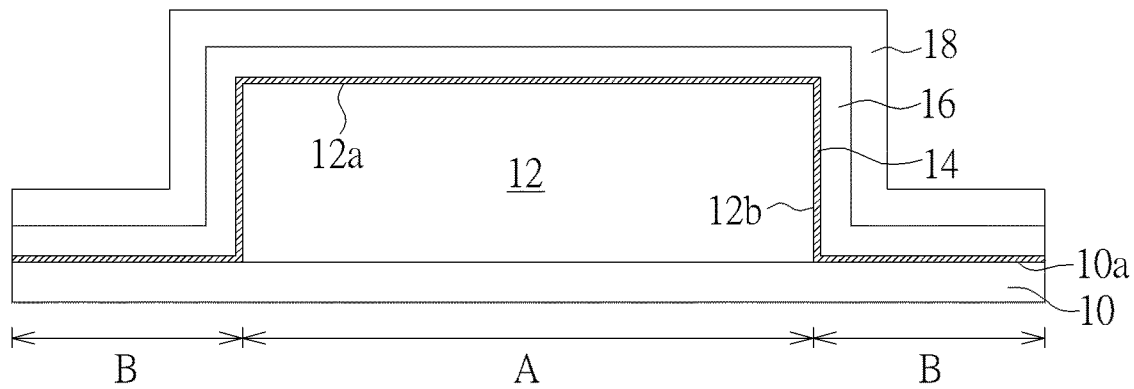

Please refer to FIG. 8. Similarly, a substrate 10 having a main surface 10a is provided. A protruding structure 12 is formed on the main surface 10a of the substrate 10. A cap layer 14, an insulating layer 16 and a stop layer 18 are successively formed conformally covering the main surface 10a of the substrate 10 and the top surface 12a and the sidewall 12b of the protruding structure 12.

Figure 9:
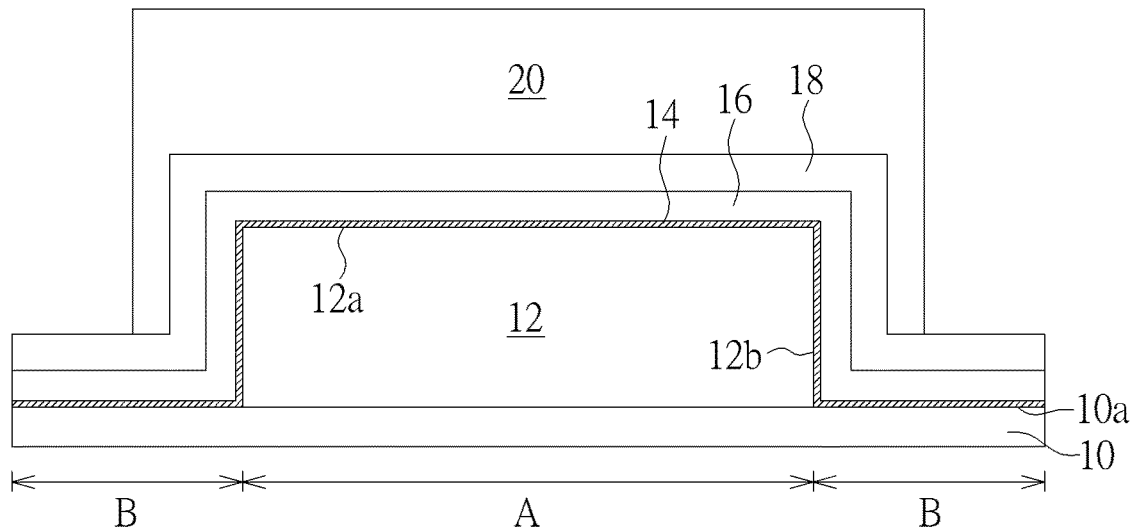
Figure 10:
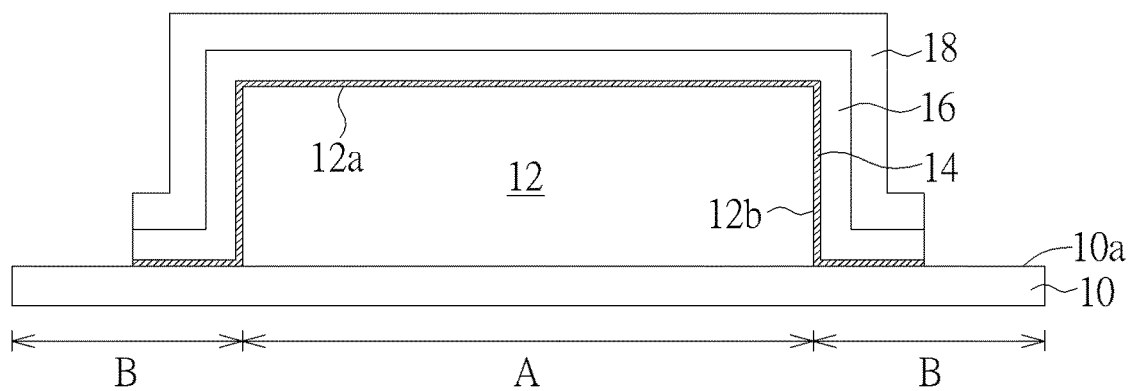

Please refer to FIG. 9 and FIG. 10. A patterning process is then performed to remove a portion of the cap layer 14, a portion of the insulating layer 16 and a portion of the stop layer 18. The patterning process may include forming a mask layer, for example, the photoresist layer 20, on the stop layer 18, aligning with the protruding structure 12 and covering the top surface 12a and sidewall 12b of the protruding structure 12. The photoresist layer 20 further extends to cover a portion of the main surface 10a adjacent to the perimeter of the protruding structure 12. An etching process is then performed, using the photoresist layer 20 as an etching mask to remove the exposed stop layer 18, insulating layer 16 and cap layer 14 in a successive manner, thereby exposing the main surface 10a of the substrate 10. After the etching process, the photoresist layer 20 is removed. As shown in FIG. 10, the top surface 12a and sidewall 12b of the protruding portion 12 and a portion of the main surface 10a adjacent to the perimeter of the protruding structure 12 are covered by the remaining stop layer 18, insulating layer 16 and cap layer 14.

Figure 11:
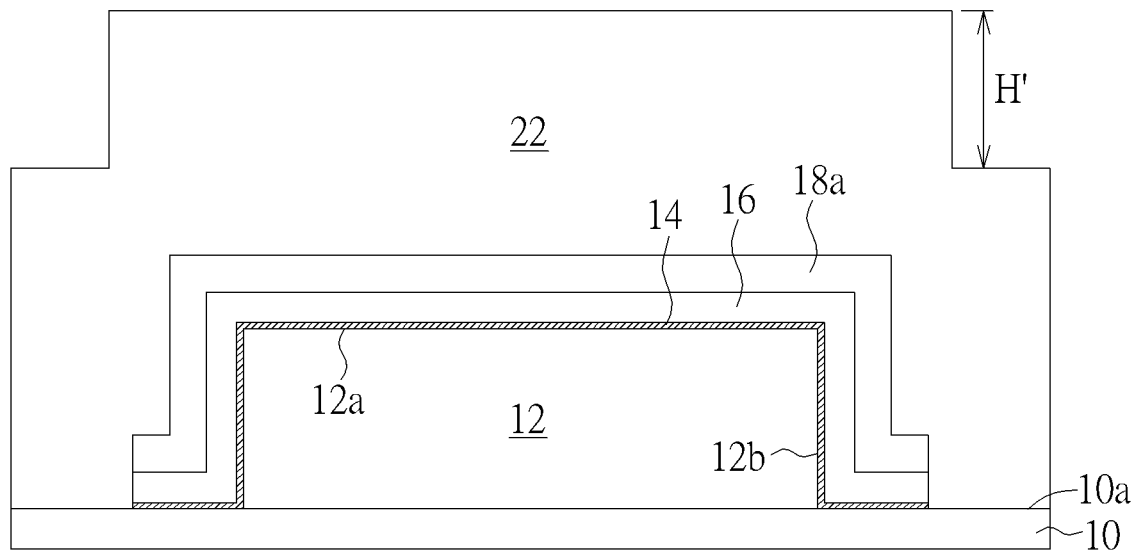

Please refer to FIG. 11. Subsequently, a first dielectric layer 22, for example, a silicon oxide layer, is formed blanketly covering the substrate 10 and the protruding structure 12. The first dielectric layer 22 directly contacts the substrate 10 but does not directly contact the protruding structure 12 by being separated by the remaining stop layer 18, insulating layer 16 and cap layer 14. Similarly, the thickness (height) of the protruding structure 12 may cause the first dielectric layer 22 having an obvious step height H' between the array region A (the protruding structure 12) and the peripheral region B.

Figure 12:
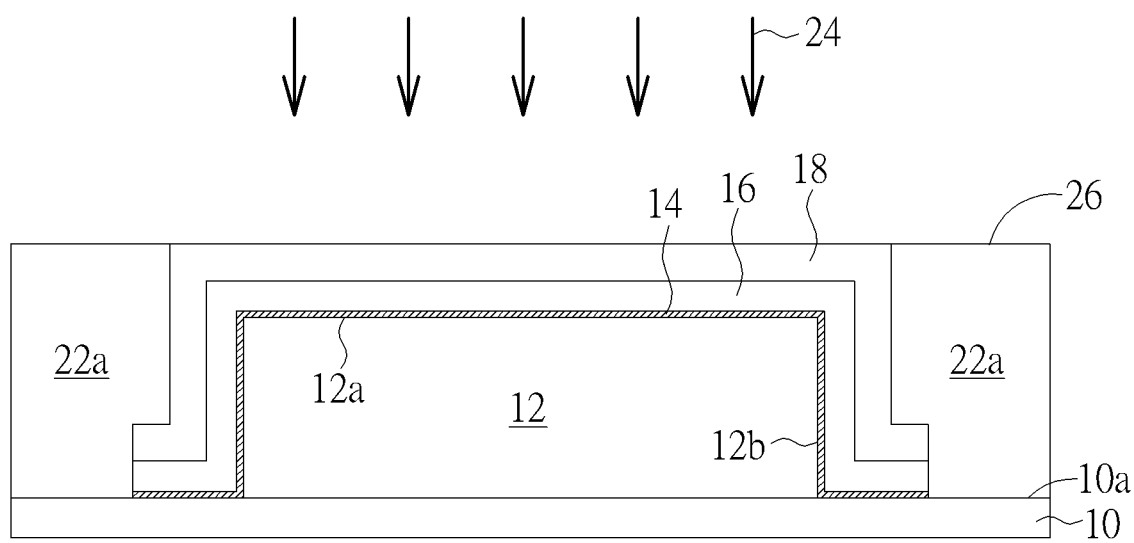

Please refer to FIG. 12. Subsequently, a chemical mechanical polishing (CMP) process 24 using the stop layer 18 as a polishing stop layer is then performed to polish away a portion of the first dielectric layer 22 until the stop layer 18 on the top surface 12a of the protruding structure 12 is exposed, and thereby obtaining a flat upper surface 26.

Please refer to FIG. 13 and FIG. 14. Next, similar to the first embodiment, a selective etching process 28 as shown in FIG. 13 or a non-selective etching process 29 as shown in FIG. 14 is then performed to remove the exposed stop layer 18. It is noteworthy that, in the non-selective etching process 29 as shown in FIG. 14, a portion of the first dielectric layer 22 is also removed in a thickness approximately the same as the thickness of the removed stop layer 18. After removing the exposed stop layer 18, a second dielectric layer 30 having a pre-determined thickness is formed blanketly covering the substrate 10 and the protruding structure 12 and completely covering the array region A and the peripheral region B.

FIG. 15 to FIG. 20 are schematic drawings illustrating a planarization method according to a third embodiment of the present invention. For the sake of simplicity, like reference numerals are used to refer to the same material layers or process steps as described in the first embodiment previously illustrated. The difference between the first embodiment and the third embodiment is that, in the third embodiment, the thickness of the insulating layer 16 is increased to a pre-determined thickness. For example, the insulating layer 16 in the third embodiment may have a thickness the same as the pre-determined thickness of the second dielectric layer 30 in the first and second embodiments. That is, after the chemical mechanical polishing process 24 to remove excess first dielectric layer 22, the insulating layer 16 having the pre-determined thickness remains covering the top surface 12a of the protruding structure 12, and therefore there is no need to additionally form another dielectric layer such as the second dielectric layer 30 on the substrate 10 and the process of the third embodiment of the present invention is therefore simplified.

Figure 15:
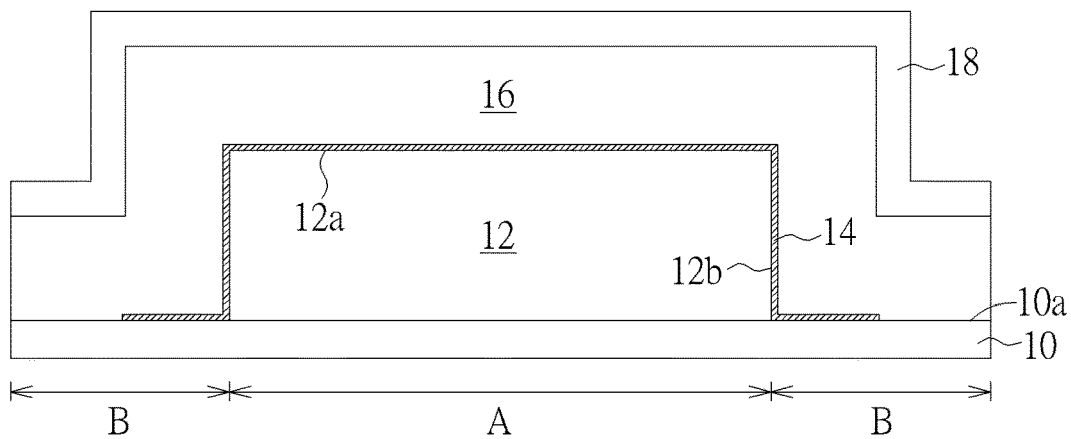
FIG. 15 to FIG. 20 are schematic drawings illustrating a planarization method according to a third embodiment of the present invention.

Please refer to FIG. 15. First, a substrate 10 having a main surface 10a is provided. A protruding structure 12 is formed on the main surface 10a of the substrate 10. An insulating layer 16 having a pre-determined thickness is formed conformally covering the main surface 10a of the substrate and the top surface 12a and sidewall 12b of the protruding structure 12. A stop layer 18 is then formed on the insulating layer 16. The insulating layer 16 may comprise silicon oxide ($SiO_2$) and have a thickness between 2500 and 3000 angstroms. The stop layer 18 may comprise silicon nitride (SiN), silicon oxynitride (SiON) or silicon carbonitride (SiCN) and have a thickness less than 100 angstroms. Preferably, the stop layer 18 has a thickness between 50 and 100 angstroms. A cap layer 14 may be formed before forming the insulating layer 16. The cap layer 14 covers the top surface 12a and sidewall 12b of the protruding structure 12 and extends to cover a portion of the main surface 10a adjacent to the perimeter of the protruding structure 12.

Figure 16:
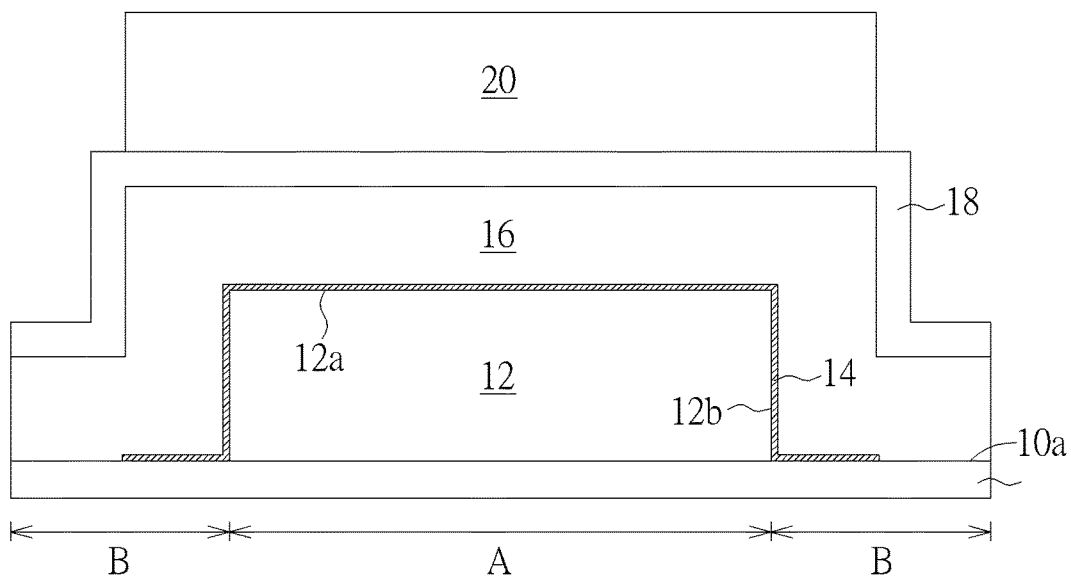
Figure 17:
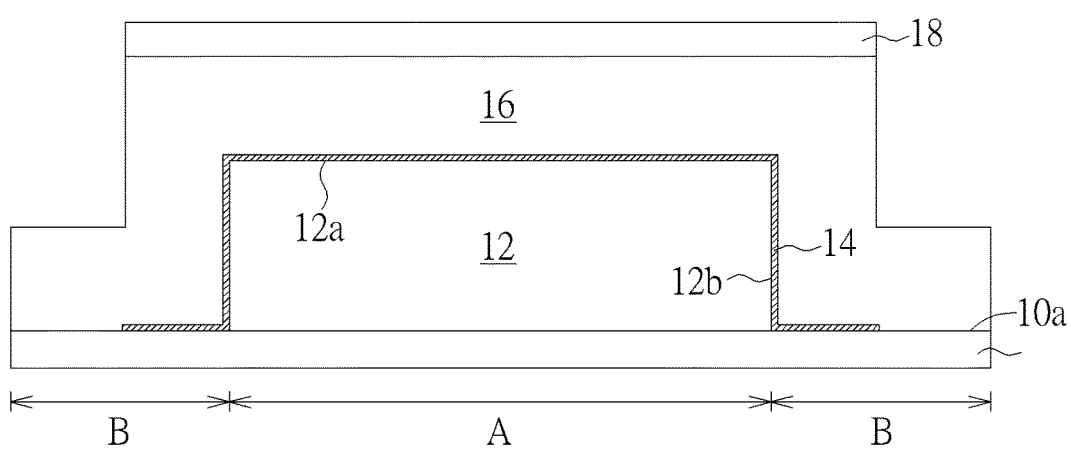

Please refer to FIG. 16 and FIG. 17. Subsequently, a patterning process is performed to remove a portion of the stop layer 18. The patterning process may include forming a mask layer, for example, the photoresist layer 20, aligning with the protruding structure 12 and only covering the top surface 12a of the protruding structure 12. The stop layer 18 on the sidewall 12b of the protruding structure 12 and the main surface 10a of the substrate 10 is exposed. An etching process using the photoresist layer 20 as an etching mask is then performed to remove the exposed stop layer 18. After the etching process, the photoresist layer 20 is removed. As shown in FIG. 17, the remaining stop layer 18 only covers the top surface 12a of the protruding portion 12. The insulating layer 16 is not removed during the etching process and none of the top surface 12a and sidewall 12b of the protruding structure 12 and the main surface 10a of the substrate 10 is exposed from the insulating layer.

Figure 18:
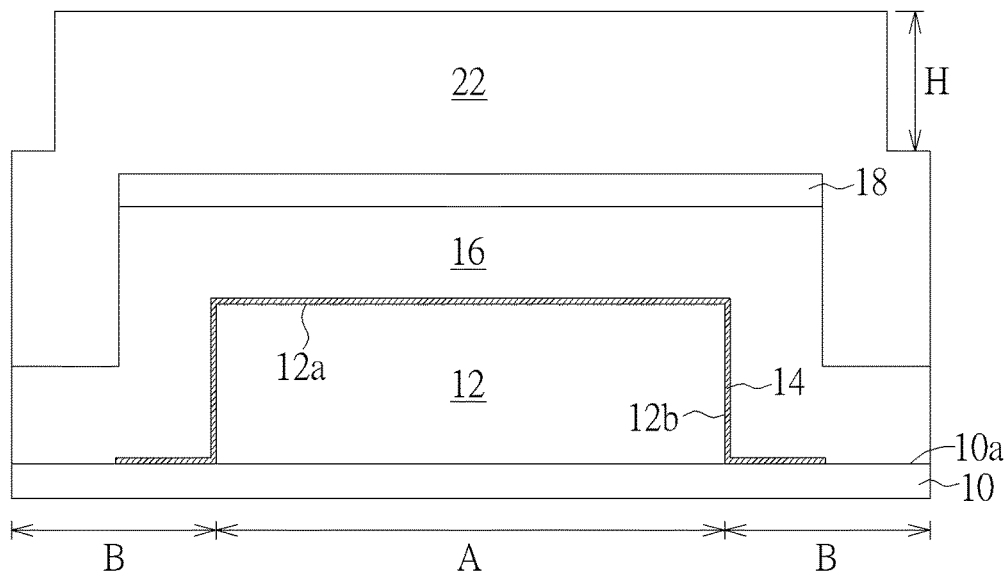

Please refer to FIG. 18. A first dielectric layer 22, for example, a silicon oxide layer, is then formed blanketly covering the substrate 10 and the protruding structure 12. The first dielectric layer 22 has a thickness at least larger than the thickness (height) of the protruding structure 12. Preferably, the first dielectric layer 22 has a thickness at least twice of the thickness (height) of the protruding structure 12 in order to allow a sufficient polished thickness for planarization during a subsequent chemical mechanical polishing process 24 (shown in FIG. 19). The first dielectric layer 22 is not in direct contact with the protruding structure 12 and the substrate 10 by being separated by the insulating layer 16. The thickness (height) of the protruding structure 12 cause the first dielectric layer 22 having an obvious step height H between the array region A and the peripheral region B.

Figure 19:
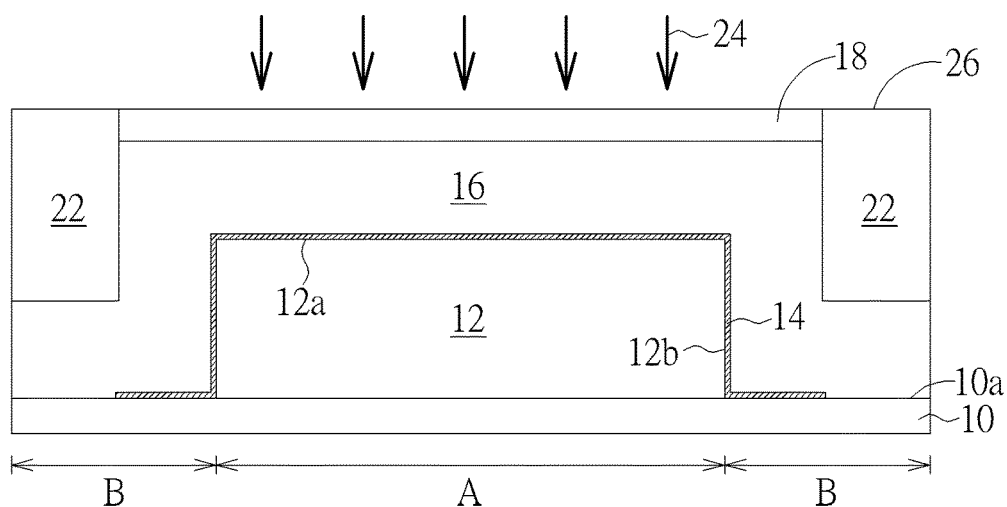

Please refer to FIG. 19. Subsequently, a chemical mechanical polishing process 24 is performed to remove a portion of the first dielectric layer 22 until a portion of the stop layer 18 is exposed and thereby obtaining a flat upper surface 26.

Figure 20:
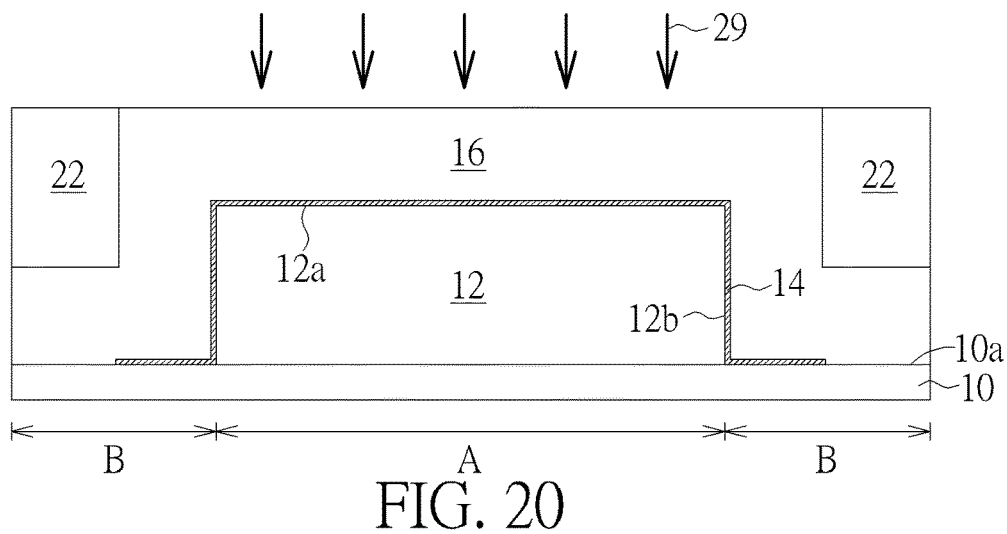

Please refer to FIG. 20. After the chemical mechanical polishing process 24, a non-selective etching process 29 such as a non-selective dry etching process or a non-selective polishing process is then performed to remove the exposed stop layer 18 and concurrently removing a portion of the first dielectric layer 22 in a thickness approximately the same as the removed stop layer 18. After removing the stop layer 18, the insulating layer 16 on the top surface 12a of the protruding structure 12 is exposed. As previously mentioned, the insulating layer 16 on the top surface 12a of the protruding structure 12 already has the pre-determined thickness and therefore there is no need to additionally form another dielectric layer on the substrate 10. It is one feature of the third embodiment that, as shown in FIG. 20, the top surface 12a of the protruding structure 12 is not covered by the first dielectric layer 22. The top surface 12a of the protruding structure 12 is covered by the insulating layer 16 as an isolating and protecting layer for subsequent process, such as forming metal interconnection or passivation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A planarization method, comprising:
    providing a substrate having a main surface;
    forming a protruding structure on the main surface, wherein the protruding structure comprises a crown-type capacitor;
    forming an insulating layer conformally covering the main surface and a top surface and a sidewall of the protruding structure;
    after forming the insulating layer, forming a stop layer completely covering the insulating layer;
    performing a patterning process to remove a portion of the stop layer thereby forming a remaining portion of the stop layer directly covering at least a portion of the insulating layer on the top surface of the protruding structure:
    forming a first dielectric layer blanketly covering the substrate and the remaining portion of the stop layer;
    performing a chemical mechanical polishing process to remove a portion of the first dielectric layer until exposing the remaining portion of the stop layer and thereby obtaining an upper surface; and
    forming a second dielectric layer having a pre-determined thickness and covering the upper surface.

2. The planarization method according to claim 1, wherein a removal rate of the stop layer in the chemical mechanical polishing process is smaller than one-tenth of a removal rate of the first dielectric layer in the chemical mechanical polishing process.

3. The planarization method according to claim 1, wherein the stop layer comprises silicon nitride, silicon oxynitride or silicon carbonitride, and the first dielectric layer comprises silicon oxide.

4. The planarization method according to claim 1, further comprising removing the remaining portion of the stop layer before forming the second dielectric layer.

5. The planarization method according to claim 1, further comprising performing a buffer polishing process after forming the second dielectric layer.

6. The planarization method according to claim 1, wherein the remaining portion of the stop layer only covers the top surface of the protruding structure.

7. The planarization method according to claim 6, wherein the first dielectric layer is completely separated from the substrate and the protruding structure by being separated by the insulating layer.

8. The planarization method according to claim 1, wherein the remaining portion of the stop layer covers the top surface and the sidewall of the protruding structure and a portion of the main surface adjacent to a perimeter of the protruding structure.

9. The planarization method according to claim 8, wherein the patterning process includes removing the insulating layer not covered by the remaining portion of the stop layer and therefore exposing a portion of the main surface.

10. The planarization method according to claim 9, wherein the first dielectric layer directly contacts the main surface.

11. The planarization method according to claim 1, wherein the insulating layer and the stop layer respectively have a thickness equal or smaller than 100 angstroms.

12. A planarization method, comprising:
    providing a substrate having a main surface;
    forming a protruding structure on the main surface, wherein the protruding structure comprises a crown-type capacitor;
    forming an insulating layer conformally covering the main surface of the substrate and a top surface and a sidewall of the protruding structure, wherein the insulating layer having a pre-determined thickness;
    after forming the insulating layer, forming a stop layer completely covering the insulating layer;
    performing a patterning process to remove a portion of the stop layer thereby forming a remaining portion of the stop layer directly covering at least a portion of the insulating layer on the top surface of the protruding structure;
    forming a first dielectric layer blanketly covering the substrate and the remaining portion of the stop layer; and performing a chemical mechanical polishing process to remove a portion of the first dielectric layer until exposing the remaining portion of the stop layer thereby obtaining an upper surface.

13. The planarization method according to claim 12, further comprising removing the remaining portion of the stop layer and exposing the insulating layer on the top surface of the protruding structure.

14. The planarization method according to claim 13, wherein a portion of the first dielectric layer is removed in a thickness approximately the same as a thickness of the remaining portion of the stop layer being removed.

15. The planarization method according to claim 12, wherein a removal rate of the stop layer in the chemical mechanical polishing process is smaller than one-tenth of a removal rate of the first dielectric layer in the chemical mechanical polishing process.

16. The planarization method according to claim 12, wherein the stop layer comprises silicon nitride, silicon oxynitride or silicon carbonitride, and the first dielectric layer comprises silicon oxide.

17. The planarization method according to claim 12, wherein the first dielectric layer is completely separated from the substrate and the protruding structure by being separated by the insulating layer.

* * * * *

UNITED STATES PATENT AND TRADEMARK OFFICE
CERTIFICATE OF CORRECTION

PATENT NO. : 10,734,276 B2
APPLICATION NO. : 15/862564
DATED : August 4, 2020
INVENTOR(S) : Po-Cheng Huang et al.

Page 1 of 1

It is certified that error appears in the above-identified patent and that said Letters Patent is hereby corrected as shown below:

On the Title Page

Item (73), the second assignee, Fujian Jinhua Integrated Circuit Co., Ltd., change "Quanzhou, Fujina province (CN)" to --Quanzhou, Fujian province (CN)--.

Signed and Sealed this
Twenty-fourth Day of August, 2021

Drew Hirshfeld
*Performing the Functions and Duties of the
Under Secretary of Commerce for Intellectual Property and
Director of the United States Patent and Trademark Office*